US006815373B2

(12) United States Patent
Singh et al.

(10) Patent No.: US 6,815,373 B2
(45) Date of Patent: Nov. 9, 2004

(54) USE OF CYCLIC SILOXANES FOR HARDNESS IMPROVEMENT OF LOW K DIELECTRIC FILMS

(75) Inventors: Vinita Singh, Mountain View, CA (US); Srinivas D. Nemani, San Jose, CA (US); Yi Zheng, San Jose, CA (US); Lihua Li, San Jose, CA (US); Tzu-Fang Huang, San Jose, CA (US); Li-Qun Xia, Santa Clara, CA (US); Ellie Yieh, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 149 days.

(21) Appl. No.: 10/124,655

(22) Filed: Apr. 16, 2002

(65) Prior Publication Data

US 2003/0194880 A1 Oct. 16, 2003

(51) Int. Cl.$^7$ .................. H01L 21/31; H01L 21/469; H01L 21/26; H01L 21/42; H01L 21/324
(52) U.S. Cl. .................. 438/787; 438/788; 438/789; 438/790
(58) Field of Search ................. 257/700, 701, 257/758, 774; 427/255.28, 56; 438/637, 638, 672, 787, 788, 789, 790

(56) References Cited

U.S. PATENT DOCUMENTS

| | | | |
|---|---|---|---|
| 5,593,741 A | 1/1997 | Ikeda ..................... | 427/579 |
| 5,598,027 A | 1/1997 | Matsuura ................. | 257/635 |
| 5,599,740 A | 2/1997 | Jang et al. .............. | 437/190 |
| 5,616,369 A | 4/1997 | Williams et al. ......... | 427/536 |
| 5,618,619 A | 4/1997 | Petrmichl et al. ........ | 428/334 |
| 5,637,351 A | 6/1997 | O'Neal et al. .......... | 427/255.3 |
| 5,638,251 A | 6/1997 | Goel et al. ............. | 361/313 |
| 5,679,413 A | 10/1997 | Petrmichl et al. ........ | 427/534 |
| 5,683,940 A | 11/1997 | Yahiro ................... | 437/195 |
| 5,693,563 A | 12/1997 | Teong .................... | 437/190 |
| 5,700,720 A | 12/1997 | Hashimoto ............... | 437/195 |
| 5,703,404 A | 12/1997 | Matsuura ................. | 257/758 |
| 5,739,579 A | 4/1998 | Chiang et al. ........... | 257/635 |
| 5,753,564 A | 5/1998 | Fukada ................... | 437/238 |
| 5,789,319 A | 8/1998 | Havemann et al. ......... | 438/668 |
| 5,800,877 A | 9/1998 | Maeda et al. ............ | 427/535 |
| 5,807,785 A | 9/1998 | Ravi ..................... | 438/624 |
| 5,821,168 A | 10/1998 | Jain ..................... | 438/692 |
| 5,834,162 A | 11/1998 | Malba .................... | 430/317 |
| 5,858,880 A | 1/1999 | Dobson et al. ........... | 438/758 |
| 5,874,367 A | 2/1999 | Dobson ................... | 438/787 |
| 5,888,593 A | 3/1999 | Petrmichl et al. ........ | 427/563 |
| 5,891,799 A | 4/1999 | Tsui ..................... | 438/624 |
| 5,989,998 A | 11/1999 | Sugahara et al. ......... | 438/623 |
| 6,037,274 A | 3/2000 | Kudo et al. ............. | 438/778 |
| 6,051,321 A | 4/2000 | Lee et al. .............. | 428/447 |
| 6,054,206 A | 4/2000 | Mountsier ............... | 428/312.8 |
| 6,054,379 A | 4/2000 | Yau et al. .............. | 438/623 |
| 6,068,884 A | 5/2000 | Rose et al. ............. | 427/255.6 |
| 6,072,227 A | 6/2000 | Yau et al. .............. | 257/642 |
| 6,080,526 A | 6/2000 | Yang et al. ............. | 430/296 |
| 6,124,641 A | 9/2000 | Matsuura ................. | 257/759 |
| 6,140,226 A | 10/2000 | Grill et al. ............ | 438/637 |
| 6,147,009 A | 11/2000 | Grill et al. ............ | 438/780 |
| 6,159,871 A | 12/2000 | Loboda et al. ........... | 438/786 |

(List continued on next page.)

FOREIGN PATENT DOCUMENTS

| | | | |
|---|---|---|---|
| DE | 196 54 737 | 7/1997 | ......... H01L/21/31 |
| DE | 198 04 375 A1 | 7/1999 | ........ H01L/21/312 |
| DE | 199 04 311 A1 | 8/1999 | .......... C23C/16/44 |
| EP | 0 771 886 A1 | 5/1997 | .......... C23C/16/36 |
| EP | 0 774 533 A1 | 5/1997 | .......... C23C/16/40 |
| EP | 0 840 365 | 5/1998 | ........ H01L/21/311 |
| EP | 0 849 789 | 6/1998 | ........ H01L/21/768 |
| EP | 0 885 983 A1 | 12/1998 | .......... C23C/16/30 |
| EP | 0 926 715 A2 | 6/1999 | ....... H01L/21/3105 |
| EP | 0 926 724 A2 | 6/1999 | .......... H01L/21/76 |
| EP | 0 935 283 A2 | 8/1999 | ........ H01L/21/312 |
| EP | 1 037 275 | 9/2000 | ........ H01L/21/768 |
| EP | 1 123 991 A2 | 8/2001 | .......... C23C/16/40 |
| GB | 2 316 535 A | 2/1998 | ......... H01L/21/31 |
| JP | 9-8031 | 1/1997 | ........ H01L/21/316 |
| JP | 9-64029 | 3/1997 | ........ H01L/21/316 |
| JP | 9-237785 | 9/1997 | ........ H01L/21/316 |
| JP | 9-251997 | 9/1997 | ........ H01L/21/316 |
| JP | 9-260369 | 10/1997 | ........ H01L/21/316 |
| JP | 10-242143 | 9/1998 | ........ H01L/21/316 |
| JP | 11-251293 A | 9/1999 | ....... H01L/21/3065 |
| WO | 98/08249 | 2/1998 | ........ H01L/21/312 |
| WO | 98/59089 | 12/1998 | .......... C23C/16/30 |
| WO | 99/38202 | 7/1999 | ........ H01L/21/312 |
| WO | 99/414263 | 8/1999 | .......... C23C/16/40 |
| WO | 99/55526 | 11/1999 | ............ B32B/9/04 |
| WO | 00/01012 | 1/2000 | .......... H01L/23/48 |
| WO | 01/01472 | 1/2001 | ........ H01L/21/312 |
| WO | 02/4311.9 | 5/2002 | |

OTHER PUBLICATIONS

"Low Dielectric Constant Insulator Formed by Downstream Plasma CVD at Room Temperature Using TMS/O2", A. Nara and H.Itoh, Japanese Journal of Applied Physics, vol. 36, No. 3B (Mar. 1997).

(List continued on next page.)

*Primary Examiner*—David A. Zarneke
*Assistant Examiner*—Asok Kumar Sarkar
(74) *Attorney, Agent, or Firm*—Moser, Patterson & Sheridan

(57) ABSTRACT

A method for depositing a low dielectric constant film having a dielectric constant of about 3.5 or less is provided by blending one or more cyclic organosilicon compounds, one or more aliphatic organosilicon compounds, and one or more low molecular weight aliphatic hydrocarbon compounds. In one aspect, a gas mixture comprising one or more cyclic organosilicon compounds, one or more aliphatic organosilicon compounds, one or more aliphatic hydrocarbon compounds, one or more oxidizing gases, and a carrier gas is reacted at conditions sufficient to deposit a low dielectric constant film on a substrate surface.

25 Claims, No Drawings

U.S. PATENT DOCUMENTS

| | | |
|---|---|---|
| 6,287,990 B1 | 9/2001 | Cheung et al. ............. 438/780 |
| 6,303,523 B2 | 10/2001 | Cheung et al. ............. 438/780 |
| 6,312,793 B1 | 11/2001 | Grill et al. ............... 428/312.6 |
| 6,316,063 B1 | 11/2001 | Andideh et al. ............ 427/577 |
| 6,413,583 B1 | 7/2002 | Moghadam et al. ... 427/249.15 |
| 6,479,110 B2 | 11/2002 | Grill et al. ................... 427/577 |
| 6,583,048 B1 | 6/2003 | Vincent et al. ............. 438/623 |
| 6,642,157 B2 | 11/2003 | Shioya et al. ............... 438/789 |
| 2001/0004479 A1 | 6/2001 | Cheung et al. ............. 427/553 |
| 2001/0005546 A1 | 6/2001 | Cheung et al. ............. 428/210 |
| 2001/0021590 A1 | 9/2001 | Matsuki ...................... 438/780 |
| 2001/0031563 A1 * | 10/2001 | Shioya et al. ............... 438/790 |
| 2001/0055672 A1 | 12/2001 | Todd .......................... 428/212 |
| 2002/0068458 A1 | 6/2002 | Chiang et al. .............. 438/694 |
| 2002/0098714 A1 | 7/2002 | Grill et al ................... 438/778 |
| 2003/0064154 A1 * | 4/2003 | Laxman et al. ........ 427/255.28 |
| 2003/0113995 A1 * | 6/2003 | Xia et al. .................... 438/638 |
| 2003/0116421 A1 | 6/2003 | Xu et al. |
| 2003/0194495 A1 | 10/2003 | Li et al. ................ 427/255.28 |
| 2003/0194496 A1 | 10/2003 | Xu et al. ............... 427/255.28 |
| 2003/0198742 A1 | 10/2003 | Vrtis et al. ............. 427/255.28 |
| 2004/0038514 A1 | 2/2004 | Hyodo et al. |
| 2004/0039219 A1 | 2/2004 | Chen et al. |

OTHER PUBLICATIONS

"Low Dielectric Constant Films Prepared by Plasma–Enhanced Chemical Vapor Deposition From Tetramethylsilane" A. Grill and V. Patel, Journal of Applied Physics, vol. 85, No. 6 (Mar. 1999).

V. Hazari et al., "Characterization Of Alternative Chemistries For Depositing PECVD Silicon Dioxide Films," DUMIC Conference,—333D/98/0319, pp. 319–326, Feb. 1998.

K. J. Taylor et al., "Parylene Copolymers", Spring MRS, Symposium N, pp. 1–9, 1997.

"Novel Low k Dilectrics Based on Diamondlike Carbon Mterials", A. Grill, et al., J. Electrochem Soc. vol. 145 No. 5, May 1998, pp. 1649–1653.

"Deposition of Low k Dielectric Films Using Trimethysilane", M. J. Loboda, et al., Electrochemical Soc. Proceedings, vol. 98–6, pp. 152.

"Low Dielectric Constant Oxide Films Deposited Using CVD Techniques," S. McClatchie, et al., Feb. 16–17, 1998, DUMIC Conf., pp. 311–318.

"Using Trimethylsilane To Improve Safety, Throughput and Versatility in PECVD Processes," M. J. Loboda, et al., Electrochemical Proceedings vol. 97–10, pp. 443–453.

"Safe Precursor Gas For Broad Replacement of $Sih_4$ In Plasma Processes Employed In Integrated Circuit Production," M. J. Loboda, et al., Materials Research Soc. vol. 447, pp. 145–151.

"Plasma Polymerization of Trimethylsilane in Cascade Arc Discharge," Y.S. Lin, et al., J. Applied Polymer Science, vol. 66, 1653–1665 (1997).

"A Comparative Study of Sub–Micron Gap Filling And Planarization Techniques," A. Haas Bar–Ilan, et al., SPIE vol. 2636, pp. 277–288.

"Reactivity of Alkylsilanes and Alkylcarbosilanes in Atomic Hydrogen–Induced Chemical Vapor Deposition," A. M. Wrobel, et al., J. Electrochem. Soc., Vol. 145, No. 3, Mar. 1998, pp. 1060–1065.

"Diamondlike Carbon Materials As BEOL Interconnect Dielectrics: Integration Issues," A. Grill, et al., Electrochemical Soc. Proceeding vol. 98–3, pp. 118–129.

Grill, et al., "Diamondlike Carbon Materials as Low–k Dielectrics" Conference Proceedings ULSI XII Materials Research Society, 1997, p. 417–422.

European Search Report for EP 00 11 2300, Dated Aug. 24, 2001.

Peter, "Pursuing the Perfect Low–K Dielectric," Semiconductor International Sep. 1998.

Zhao, et al., "Integration of Low Dielectric Constant Materials in Advanced Aluminum and Copper Interconnects, " Mat. Res. Soc. Symp. Proc. vol. 564, 1999, p. 485–497.

Robles, et al., "Characterization of High Density Plasma Chemical Vapor Deposit alpha–Carbon and alpha–Fluorinated Carbon Films for Ultra Low Dielectric Applications," DUMIC Conference, Feb. 1997, p. 26–33.

Sugahara, et al. "Low Dielectric Constant Carbon Containing SiO2 Films Deposited by PECVD Technique Using a Novel CVD Precursor," DUMIC Conference, Feb. 1997, p. 19–25.

* cited by examiner

USE OF CYCLIC SILOXANES FOR HARDNESS IMPROVEMENT OF LOW K DIELECTRIC FILMS

BACKGROUND OF THE INVENTION

1. Field of the Invention

Embodiments of the present invention relate to the fabrication of integrated circuits. More particularly, embodiments of the present invention relate to a process for depositing dielectric layers on a substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 μm and even 0.1 μm feature sizes, and tomorrow's facilities soon will be producing devices having even smaller feature sizes.

The continued reduction in device geometries has generated a demand for films having lower dielectric constant values because the capacitive coupling between adjacent metal lines must be reduced to further reduce the size of devices on integrated circuits. In particular, insulators having low dielectric constants (k), such as less than about 4.0, are desirable. Examples of insulators having low dielectric constants include spin-on glass, such as un-doped silicon glass (USG) or fluorine-doped silicon glass (FSG), carbon-doped silicon oxide (e.g., Black Diamond™ film, available from Applied Materials, Inc. of Santa Clara, Calif.), and polytetrafluoroethylene (PTFE), which are all commercially available.

More recently, organosilicon films having k values less than about 3.5 have been developed. In an attempt to further lower k values, Rose et al. (U.S. Pat. No. 6,068,884) disclosed a method for depositing an insulator by partially fragmenting a cyclic organosilicon compound to form both cyclic and linear structures in the deposited film. However, this method of partially fragmenting cyclic precursors is difficult to control and thus, product consistency is difficult to achieve.

Many of the currently used organosilicon films having low k values are not hard enough to withstand chemical mechanical polishing used in the fabrication of integrated circuits. Although the organosilicon films can be capped with conventional silicon oxides to improve hardness, such cap layers will increase the effective dielectric constant.

There is a need, therefore, for a controllable process for making harder low dielectric constant materials to improve the speed, efficiency, and durability of devices on integrated circuits.

SUMMARY OF THE INVENTION

Embodiments of the invention include a method for depositing a low dielectric constant film having a dielectric constant of about 3.5 or less, preferably about 3 or less, by blending one or more cyclic organosilicon compounds, one or more aliphatic organosilicon compounds, and one or more low molecular weight aliphatic hydrocarbon compounds. In one aspect, a gas mixture comprising one or more cyclic organosilicon compounds, one or more aliphatic organosilicon compounds, and one or more aliphatic hydrocarbon compounds are reacted at conditions sufficient to deposit a low dielectric constant film on a substrate surface. In one embodiment, a method for depositing a low dielectric constant film having a dielectric constant of about 3.5 or less includes reacting a gas mixture including octamethylcyclotetrasiloxane, trimethylsilane, and ethylene at conditions sufficient to deposit the low dielectric constant film on a substrate surface. The gas mixture may further include oxygen and helium.

In another aspect, embodiments of the invention provide a method of depositing a dielectric film having a dielectric constant of about 3 or less and a hardness of between about 1.0 gigaPascal and about 2.9 gigaPascal.

DETAILED DESCRIPTION OF THE PREFERRED EMBODIMENT

Embodiments of the invention provide an improved hardness in low dielectric constant films containing silicon, oxygen, and carbon by blending one or more cyclic organosilicon compounds, one or more aliphatic organosilicon compounds, and one or more low molecular weight aliphatic hydrocarbon compounds at conditions sufficient to form a low dielectric constant film (k less than 3.5). The films contain a network of —Si—O—Si—ring structures that are crosslinked with linear segments of one or more linear organic compounds. Because of the crosslinkage, a network is produced having a significant separation between ring structures and thus, the deposited films possess a significant degree of porosity.

The cyclic organosilicon compounds include a ring structure comprising three or more silicon atoms and the ring structure may further comprise one or more oxygen and/or carbon atoms. For example, the cyclic organosilicon compounds include the following compounds:

| | |
|---|---|
| 1,3,5-trisilano-2,4,6-trimethylene, | —(—SiH$_2$CH$_2$—)$_3$— (cyclic) |
| 1,3,5,7-tetramethylcyclotetrasiloxane (TMCTS) | —(—SiHCH$_3$—O—)$_4$— (cyclic) |
| octamethylcyclotetrasiloxane (OMCTS), | —(—Si(CH$_3$)$_2$—O—)$_4$— (cyclic) |
| 1,3,5,7,9-pentamethylcyclopentasiloxane, | —(—SiHCH$_3$—O—)$_5$— (cyclic) |
| 1,3,5,7-tetrasilano-2,6-dioxy-4,8-dimethylene, | —(—SiH$_2$—CH$_2$—SiH$_2$—O—)$_2$— (cyclic) |
| hexamethylcyclotrisiloxane | —(—Si(CH$_3$)$_2$—O—)$_3$— (cyclic). |

The aliphatic organosilicon compounds include linear or branched (i.e. acyclic) organosilicon compounds having one or more silicon atoms and one or more carbon atoms. The structures may further comprise oxygen. Commercially available aliphatic organosilicon compounds include organosilanes that do not contain oxygen between silicon atoms and organosiloxanes that contain oxygen between two or more silicon atoms. For example, the aliphatic organosilicon compounds may include one or more of the following compounds:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| dimethyldimethoxysilane, | $(CH_3)_2$—$Si$—$(OCH_3)_2$ |
| ethylsilane, | $CH_3$—$CH_2$—$SiH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SIH_3$ |
| 1,3-dimethyldisiloxane, | $CH_3$—$SiH_2$—$O$—$SiH_2$—$CH_3$ |
| 1,1,3,3-tetramethyldisiloxane (TMDSO), | $(CH_3)_2$—$SiH$—$O$—$SiH$—$(CH_3)_2$ |
| hexamethyldisiloxane (HMDS), | $(CH_3)_3$—$Si$—$O$—$Si$—$(CH_3)_3$ |
| 1,3-bis(silanomethylene)disiloxane, | $(SiH_3$—$CH_2$—$SiH_2$—$)_2$—$O$ |
| bis(1-methyldisiloxanyl)methane, | $(CH_3$—$SiH_2$—$O$—$SiH_2$—$)_2$—$CH_2$ |
| 2,2-bis(1-methyldisiloxanyl)propane, | $(CH_3$—$SiH_2$—$O$—$SiH_2$—$)_2$—$C(CH_3)_2$ |
| hexamethoxydisiloxane (HMDOS), | $(CH_3O)_3$—$Si$—$O$—$Si$—$(OCH_3)_3$ |
| diethylsilane, | $(C_2H_5)_2SiH_2$ |
| propylsilane, | $C_3H_7SiH_3$ |
| vinylmethylsilane, | $(CH_2$=$CH)CH_3SiH_2$ |
| 1,1,2,2-tetramethyldisilane, | $HSi(CH_3)_2$—$Si(CH_3)_2H$ |
| hexamethyldisilane, | $(CH_3)_3Si$—$Si(CH_3)_3$ |
| 1,1,2,2,3,3-hexamethyltrisilane, | $H(CH_3)_2Si$—$Si(CH_3)_2$—$SiH(CH_3)_2$ |
| 1,1,2,3,3-pentamethyltrisilane, | $H(CH_3)_2Si$—$SiH(CH_3)$—$SiH(CH_3)_2$ |
| dimethyldisilanoethane, | $CH_3$—$SiH_2$—$(CH_2)_2$—$SiH_2$—$CH_3$ |
| dimethyldisilanopropane, | $CH_3$—$SiH$—$(CH_2)_3$—$SiH$—$CH_3$ |
| tetramethyldisilanoethane, | $(CH_3)_2$—$SiH$—$(CH_2)_2$—$SiH$—$(CH_3)_2$ |
| tetramethyldisilanopropane | $(CH_3)_2$—$Si$—$(CH_2)_3$—$Si$—$(CH_3)_2$. |

The low molecular weight aliphatic hydrocarbon compounds include linear or branched (i.e., acyclic) hydrocarbon compounds having between about one and about 20 adjacent carbon atoms. The hydrocarbon compounds can include adjacent carbon atoms that are bonded by any combination of single, double, and triple bonds. For example, the hydrocarbon compounds include alkenes and alkylenes having two to about 20 carbon atoms, such as ethylene, propylene, acetylene, and butadiene.

One or more oxidizing gases may be combined with the one or more cyclic organosilicon compounds, the one or more aliphatic organosilicon compounds, and the one or more low molecular weight aliphatic hydrocarbon compounds. The one or more oxidizing gases may include oxygen ($O_2$), ozone ($O_3$), nitrous oxide ($N_2O$), carbon monoxide (CO), carbon dioxide ($CO_2$), water ($H_2O$), peroxide ($H_2O_2$), or combinations thereof. In one aspect, the oxidizing gas is oxygen gas. In another aspect, the oxidizing gas is ozone. When ozone is used as an oxidizing gas, an ozone generator converts from 6% to 20%, typically about 15%, by weight of the oxygen in a source gas to ozone, with the remainder typically being oxygen. The ozone concentration may be increased or decreased based upon the amount of ozone desired and the type of ozone generating equipment used. The one or more oxidizing gases are added to the reactive gas mixture to increase reactivity and achieve the desired carbon content in the deposited film.

A carrier gas such as helium, argon, nitrogen, or hydrogen may also be blended with the compounds and gases described above.

The films contain a carbon content between about 10 and about 17 atomic percent (excluding hydrogen atoms). The carbon content of the deposited films refers to atomic analysis of the film structure which typically does not contain significant amounts of non-bonded residual hydrocarbons. The carbon contents are represented by the percent of carbon atoms in the deposited film, excluding hydrogen atoms which are difficult to quantify. For example, a film having an average of one silicon atom, one oxygen atom, one carbon atom, and two hydrogen atoms has a carbon content of 20 atomic percent (one carbon atom per five total atoms), or a carbon content of 33 atomic percent excluding hydrogen atoms (one carbon atom per three total atoms).

Typically, the films may have an oxygen to silicon ratio of about 2:1, a silicon to carbon ratio of about 1:1, and a carbon to hydrogen ratio of about 1:3. In one aspect, a deposited film has about 39% hydrogen, about 13.5% carbon, about 28.5% oxygen, and about 19% silicon.

The film may be deposited using any processing chamber capable of chemical vapor deposition (CVD). For example, the film may be deposited using the chamber described in U.S. Pat. No. 6,176,198 B1, filed Nov. 2, 1998, entitled, "Apparatus and Method for Depositing Low K Dielectric Materials," which is herein incorporated by reference. Alternatively, the film may be deposited using the chamber described in U.S. Pat. No. 5,855,681, filed Nov. 18, 1996, entitled, "Ultra High Throughput Wafer Vacuum Processing System," which is herein incorporated by reference.

During deposition, a blend/mixture of one or more cyclic organosilicon compounds, one or more aliphatic organosilicon compounds, and one or more low molecular weight aliphatic hydrocarbon compounds are reacted to form a low k film on the substrate. The mixture may also contain one or more oxidizing gases and a carrier gas. For example, the mixture may contain about 4 percent by volume to about 8 percent by volume of the one or more cyclic organosilicon compounds, about 13 percent by volume to about 17 percent by volume of the one or more aliphatic organosilicon compounds, about 22 percent by volume to about 28 percent by volume of the one or more aliphatic hydrocarbon compounds, about 13 percent by volume to about 28 percent by volume of the one or more oxidizing gases, and about 28 percent by volume to about 44 percent by volume of the carrier gas.

In another aspect, the components of the mixtures described above are introduced into a chamber at certain flowrates. The flowrates described below are the flowrates per one 300 mm substrate. In one aspect, the one or more cyclic organosilicon compounds are introduced into a processing region of a chamber at a flowrate of about 75 to about 151 standard cubic centimeters per minute (sccm). The one or more aliphatic organosilicon compounds are introduced into the processing region of the chamber at a flowrate of about 150 to about 300 sccm. The one or more aliphatic hydrocarbon compounds are introduced into the processing region of the chamber at a flowrate of about 250 to about 500 sccm. An oxygen containing gas may be introduced into the processing region of the chamber at a flowrate of about 100 sccm to about 600 sccm, such as about 300 sccm. A carrier gas may be introduced into the processing region of the chamber at a flowrate of about 300 sccm to about 1,000 sccm, such as about 600 sccm. In another aspect, the cyclic organosilicon compound is octamethylcyclotetrasiloxane, the aliphatic organosilicon compound is trimethylsilane, and the aliphatic hydrocarbon compound is ethylene.

The deposition process can be either a thermal process or a plasma enhanced process. The RF power to the deposition chamber may be cycled or pulsed to reduce heating of the substrate and promote greater porosity in the deposited film. The power density of the plasma for a 300 mm substrate may be between about 0.03 Watts/cm$^2$ (W/cm$^2$) and about 4.8 W/cm$^2$, which corresponds to a RF power level of about 20 Watts (W) to about 3400 W.

The RF power supply 25 can supply a single frequency RF power between about 0.01 MHz and 300 MHz. Alternatively, the RF power may be delivered using mixed, simultaneous frequencies to enhance the decomposition of reactive species introduced into the high vacuum region 15. In one aspect, the mixed frequency is a lower frequency of about 356 kHz and a higher frequency of about 13.56 mHz. In another aspect, the higher frequency may range between about 13.56 mHz and about 65 mHz.

During deposition, the substrate is maintained at a temperature between about −20° C. and about 500° C., such as between about 100° C. and about 400° C. The deposition pressure is typically between about 1 Torr and about 20 Torr, such as between about 3 Torr and about 7 Torr. The deposition rate is typically between about 4,000 Å/min and about 20,000 Å/min.

EXAMPLES

The following examples illustrate low dielectric films of other processes and of embodiments of the present invention. The films were deposited using a chemical vapor deposition chamber that is part of an integrated processing platform. In particular, the films were deposited using a 300 mm Producer® system, available from Applied Materials, Inc. of Santa Clara, Calif. The flowrates in the examples are given with respect to the total flow to the Producer® system, i.e., the total flow to both of the processing regions, which may each contain one 300 mm substrate. The flowrates per substrate or processing region (not listed) are approximately half of the flowrates of the examples.

Comparative Example 1

A low dielectric constant film was deposited on a 300 mm substrate from the following reactive gases at a chamber pressure of about 3 Torr and substrate temperature of about 400° C. with the following flowrates:

Octamethylcyclotetrasiloxane (OMCTS), at about 302 sccm;

Trimethylsilane, at about 600 sccm;

Oxygen, at about 600 sccm; and

Helium, at about 1200 sccm.

The substrate was positioned about 300 mils from the gas distribution showerhead. A power level of about 1,100 W at a frequency of 13.56 MHz was applied to the showerhead for plasma enhanced deposition of the film. The film was deposited at a rate of about 5,600 Å/min, and had a dielectric constant (k) of about 2.86 measured at 1 MHz, and a hardness of about 2.09 gigaPascal (gPa).

Comparative Example 2

A low dielectric constant film was deposited on a 300 mm substrate from the following reactive gases at a chamber pressure of about 3 Torr and substrate temperature of about 400° C. with the following flowrates:

Octamethylcyclotetrasiloxane (OMCTS), at about 302 sccm;

Trimethylsilane (TMS), at about 600 sccm;

Oxygen, at about 600 sccm; and

Helium, at about 1,600 sccm.

The substrate was positioned about 300 mils from the gas distribution showerhead. A power level of about 1,100 W at a frequency of 13.56 MHz was applied to the showerhead for plasma enhanced deposition of the film. The film was deposited at a rate of about 5,300 Å/min, had a dielectric constant (k) of about 2.90 measured at 1 MHz, and a hardness of about 2.40 gigaPascal (gPa).

Example 3

A low dielectric constant film was deposited on a 300 mm substrate from the following reactive gases at a chamber pressure of about 4.5 Torr and substrate temperature of about 400° C. with the following flowrates:

Octamethylcyclotetrasiloxane (OMCTS), at about 151 sccm;

Trimethylsilane (TMS), at about 600 sccm;

Ethylene, at about 1,000 sccm;

Oxygen, at about 600 sccm; and

Helium, at about 1,200 sccm.

The substrate was positioned about 350 mils from the gas distribution showerhead. A power level of about 1,100 W at a frequency of 13.56 MHz was applied to the showerhead for plasma enhanced deposition of the film. The film was deposited at a rate of about 5,300 Å/min, and had a dielectric constant (k) of about 3.06 measured at 1 MHz, and a hardness of about 2.1 gPa.

Example 4

A low dielectric constant film was deposited on a 300 mm substrate from the following reactive gases at a chamber pressure of about 3.5 Torr and substrate temperature of about 400° C. with the following flowrates:

Octamethylcyclotetrasiloxane (OMCTS), at about 302 sccm;

Trimethylsilane (TMS), at about 600 sccm;

Ethylene, at about 1,000 sccm;

Oxygen, at about 600 sccm; and

Helium, at about 2,000 sccm.

The substrate was positioned about 350 mils from the gas distribution showerhead. A power level of about 1,000 W at a frequency of 13.56 MHz was applied to the showerhead for plasma enhanced deposition of the film. The film was deposited at a rate of about 4,100 Å/min, and had a dielectric constant (k) of about 3.05 measured at 1 MHz, and a hardness of about 2.16 gPa.

Example 5

A low dielectric constant film was deposited on a 300 mm substrate from the following reactive gases at a chamber pressure of about 4.5 Torr and substrate temperature of about 400° C. with the following flowrates:

Octamethylcyclotetrasiloxane (OMCTS), at about 227 sccm;
Trimethylsilane (TMS), at about 600 sccm;
Ethylene, at about 1,000 sccm;
Oxygen, at about 600 sccm; and
Helium, at about 1,200 sccm.

The substrate was positioned about 300 mils from the gas distribution showerhead. A power level of about 1,200 W at a frequency of 13.56 MHz was applied to the showerhead for plasma enhanced deposition of the film. The film was deposited at a rate of about 6,300 Å/min, and had a dielectric constant (k) of about 3.13 measured at 1 MHz, and a hardness of about 2.07 gPa.

Example 6

A low dielectric constant film was deposited on a 300 mm substrate from the following reactive gases at a chamber pressure of about 4 Torr and substrate temperature of about 400° C. with the following flowrates:

Octamethylcyclotetrasiloxane (OMCTS), at about 151 sccm;
Trimethylsilane (TMS), at about 300 sccm;
Ethylene, at about 500 sccm;
Oxygen, at about 600 sccm; and
Helium, at about 600 sccm.

The substrate was positioned about 300 mils from the gas distribution showerhead. A power level of about 1,000 W at a frequency of 13.56 MHz was applied to the showerhead for plasma enhanced deposition of the film. The film was deposited at a rate of about 5,500 Å/min and had a dielectric constant (k) of about 2.94 measured at 1 MHz, and a hardness of about 2.5 gPa.

Example 7

A low dielectric constant film was deposited on a 300 mm substrate from the following reactive gases at a chamber pressure of about 3.5 Torr and substrate temperature of about 400° C. with the following flowrates:

Octamethylcyclotetrasiloxane (OMCTS), at about 227 sccm;
Trimethylsilane (TMS), at about 450 sccm;
Ethylene, at about 750 sccm;
Oxygen, at about 600 sccm; and
Helium, at about 900 sccm.

The substrate was positioned about 300 mils from the gas distribution showerhead. A power level of about 1,000 W at a frequency of 13.56 MHz was applied to the showerhead for plasma enhanced deposition of the film. The film was deposited at a rate of about 5,100 Å/min, and had a dielectric constant (k) of about 2.87 measured at 1 MHz, and a hardness of about 2.3 gPa.

Example 8

A low dielectric constant film was deposited on a 300 mm substrate from the following reactive gases at a chamber pressure of about 4 Torr and substrate temperature of about 400° C. with the following flowrates:

Octamethylcyclotetrasiloxane (OMCTS), at about 302 sccm;
Trimethylsilane (TMS), at about 600 sccm;
Ethylene, at about 1,000 sccm;
Oxygen, at about 600 sccm; and
Helium, at about 1,200 sccm.

The substrate was positioned about 350 mils from the gas distribution showerhead. A power level of about 1,000 W at a frequency of 13.56 MHz and a power level of about 200 W at a frequency of 356 kHZ were applied to the showerhead for plasma enhanced deposition of the film. The film was deposited at a rate of about 13,000 Å/min, and had a dielectric constant (k) of about 3.06 measured at 1 MHz, and a hardness of about 2.21 gPa.

Example 9

A low dielectric constant film was deposited on a 300 mm substrate from the following reactive gases at a chamber pressure of about 3 Torr and substrate temperature of about 400° C. with the following flowrates:

Octamethylcyclotetrasiloxane (OMCTS), at about 302 sccm;
Trimethylsilane (TMS), at about 600 sccm;
Ethylene, at about 1,000 sccm;
Oxygen, at about 600 sccm; and
Helium, at about 1,200 sccm.

The substrate was positioned about 300 mils from the gas distribution showerhead. A power level of about 1,100 W at a frequency of 13.56 MHz was applied to the showerhead for plasma enhanced deposition of the film. The film was deposited at a rate of about 5,600 Å/min, and had a dielectric constant (k) of about 2.92 measured at 1 MHz, and a hardness of about 2.35 gPa.

It is believed that the combination of a cyclic organosilicon compound, such as octamethylcyclotetrasiloxane, an aliphatic organosilicon compound, such as trimethylsilane, and a low molecular weight aliphatic hydrocarbon, such as ethylene, produces a film with a desirable combination of a low dielectric constant and a good hardness, such as greater than about 1.0 gPa, such as between about 1.0 gPa and about 2.9 gPa. In another aspect, the hardness is as high as possible for a given low dielectric constant.

A process, such as the processeses described in Comparative Examples 1 and 2, that includes a cyclic organosilicon compound and an aliphatic organosilicon compound, but not a low molecular weight aliphatic hydrocarbon, can be used to deposit a film with a low dielectric constant. The film deposited by the process of Comparative Example 2 had a desirable combination of a low dielectric constant and a good hardness. However, it has been found that such processes without an aliphatic hydrocarbon compound are difficult to control and have a narrow set of processing conditions that may be used.

Example 8 represents an aspect that has a wide processing condition window. It is believed that the use of mixed radio frequency powers with the processes described herein contributes to a wide processing window. Example 7 also had a high deposition rate, which increases substrate processing throughput.

While the foregoing is directed to embodiments of the present invention, other and further embodiments of the invention may be devised without departing from the basic scope thereof, and the scope thereof is determined by the claims that follow.

What is claimed is:

1. A method for depositing a low dielectric constant film having a dielectric constant of about 3.5 or less, comprising reacting a gas mixture comprising:
 about 4 percent by volume to about 8 percent by volume of one or more cyclic organosilicon compounds;
 one or more aliphatic organosilicon compounds; and
 one or more low molecular weight aliphatic hydrocarbon compounds at conditions sufficient to deposit the low dielectric constant film on a substrate surface, the low dielectric constant film having a hardness of between about 1.0 gigaPascal and about 2.9 gigaPascal.

2. The method of claim 1, wherein the one or more cyclic organosilicon compounds comprise at least one silicon-carbon bond.

3. The method of claim 1, wherein the one or more aliphatic organosilicon compounds comprise a silicon-hydrogen bond.

4. The method of claim 1, wherein the one or more cyclic organosilicon compounds is selected from the group consisting of 3,5-trisilano-2,4,6-trimethylene, 1,3,5,7-tetramethylcyclotetrasiloxane (TMCTS), octamethylcyclotetrasiloxane (OMCTS), 1,3,5,7,9-pentamethylcyclopentasiloxane, 1,3,5,7-tetrasilano-2,6-dioxy-4,8-dimethylene, and hexamethylcyclotrisiloxane.

5. The method of claim 1, wherein the one or more aliphatic organosilicon compounds is selected from the group consisting of methylsilane, dimethylsilane, trimethylsilane, dimethyldimethoxysilane, ethylsilane, disilanomethane, bis(methylsilano)methane, 1,2-disilanoethane, 1,2-bis(methylsilano)ethane, 2,2-disilanopropane, 1,3-dimethyldisiloxane, 1,1,3,3-tetramethyldisiloxane (TMDSO), hexamethyldisiloxane (HMDS), 1,3-bis(silanomethylene)disiloxane, bis(1-methyldisiloxanyl)methane, 2,2-bis(1-methyldisiloxanyl)propane, diethylsilane, propylsilane, vinylmethylsilane, 1,1,2,2-tetramethyldisilane, hexamethyldisilane, 1,1,2,2,3,3-hexamethyltrisilane, 1,1,2,3,3-pentamethyltrisilane, dimethyldisilanoethane, dimethyldisilanopropane, tetramethyldisilanoethane, and tetramethyldisilanopropane.

6. The method of claim 1, wherein the one or more low molecular weight aliphatic hydrocarbons is selected from the group consisting of ethylene, propylene, acetylene, and butadiene.

7. The method of claim 1, wherein the gas mixture comprises:
 about 13 percent by volume to about 17 percent by volume of the one or more aliphatic organosilicon compounds; and
 about 22 percent by volume to about 28 percent by volume of the one or more low molecular weight aliphatic hydrocarbon compounds.

8. The method of claim 7, wherein the one or more cyclic organosilicon compounds is selected from the group consisting of 1,3,5,7-tetramethylcyclotetrasiloxane (TMCTS) and octamethylcyclotetrasiloxane (OMTS).

9. The method of claim 8, wherein the one or more aliphatic organosilicon compounds is selected from the group consisting of methylsilane, dimethylsilane, and trimethylsilane.

10. The method of claim 9, wherein the one or more low molecular weight aliphatic hydrocarbon compound is ethylene.

11. The method of claim 10, wherein the gas mixture further comprises about 13 percent by volume to about 28 percent by volume of one or more oxidizing gases and about 28 percent by volume to about 44 percent by volume of a carrier gas.

12. The method of claim 11, wherein the one or more oxidizing gases is oxygen and the carrier gas is helium.

13. The method of claim 1, wherein the gas mixture further comprises one or more oxidizing gases.

14. The method of claim 13, wherein the one or more oxidizing gases is oxygen.

15. The method of claim 13, wherein the gas mixture further comprises a carrier gas.

16. The method of claim 15, wherein the carrier gas is helium.

17. The method of claim 1, wherein the conditions comprise a power density ranging from about 0.03 W/cm$^2$ to about 4.8 W/cm$^2$.

18. The method of claim 1, wherein the conditions comprise a substrate temperature of about 100° C. to about 400° C.

19. The method of claim 1, wherein the conditions comprise a pressure of about 3 Torr to about 7 Torr.

20. The method of claim 1, wherein the conditions comprise radio frequency power delivered using mixed frequencies.

21. The method of claim 20, wherein the mixed frequencies comprise a lower frequency of between about 300 Hz and about 1,000 kHz and a higher frequency of between about 5 mHz and about 50 mHz.

22. A method for depositing a low dielectric constant film having a dielectric constant of about 3.5 or less, comprising reacting a gas mixture comprising:
 about 4 percent by volume to about 8 percent by volume of octamethylcyclotetrasiloxane;
 trimethylsilane; and
 ethylene
at conditions sufficient to deposit the low dielectric constant film on the substrate surface, the low dielectric constant film having a hardness of between about 1.0 gigaPascal and about 2.9 gigaPascal.

23. The method of claim 22, wherein the gas mixture further comprises oxygen and helium.

24. The method of claim 23, wherein the gas mixture comprises:
 about 13 percent by volume to about 17 percent by volume of trimethylsilane;
 about 22 percent by volume to about 28 percent by volume of ethylene;
 about 13 percent by volume to about 28 percent by volume of oxygen; and
 about 28 percent by volume to about 44 percent by volume of helium.

25. The method of claim 24, wherein the conditions comprise radio frequency power delivered using mixed frequencies.

* * * * *

UNITED STATES PATENT AND TRADEMARK OFFICE
CERTIFICATE OF CORRECTION

PATENT NO. : 6,815,373 B2
APPLICATION NO. : 10/124655
DATED : Nov. 9, 2004
INVENTOR(S) : Vinita et al.

It is certified that error appears in the above-identified patent and that said Letters Patent is hereby corrected as shown below:

Title Page, FOREIGN PATENT DOCUMENTS, under References Cited

Replace:

"WO 99/414263 "   with   "WO 99/41423"

"WO 02/4311.9"   with   "WO 02/43119"

Column 9, line 57, delete "OMOTS" and replace with "OMCTS".

Signed and Sealed this

Twenty-fifth Day of July, 2006

JON W. DUDAS
*Director of the United States Patent and Trademark Office*